United States Patent [19]

Luijben et al.

[11] 4,448,827

[45] May 15, 1984

[54] OPTICALLY READABLE INFORMATION DISC COMPRISING AN ENVELOPE OF CROSS-LINKED SYNTHETIC RESIN

[75] Inventors: Henricus G. J. A. M. Luijben; Herman C. Meinders, both of Eindhoven, Netherlands

[73] Assignee: U.S. Philips Corporation, New York, N.Y.

[21] Appl. No.: 491,622

[22] Filed: May 5, 1983

[30] Foreign Application Priority Data

Feb. 24, 1983 [NL] Netherlands .......................... 8300685

[51] Int. Cl.³ .......................... B65D 1/00; B32B 27/36
[52] U.S. Cl. ..................................... 428/35; 369/274; 369/275; 428/201; 428/203; 428/205; 428/412; 428/913
[58] Field of Search ................. 428/195, 913, 412, 35, 428/201, 203, 205; 369/274, 275

[56] References Cited

U.S. PATENT DOCUMENTS 4,272,574  6/1981  Lippits et al. .................. 428/913 X
4,389,719  6/1983  Donk et al. ..................... 428/913 X
4,397,923  8/1983  Yasuda et al. .................. 428/913 X

*Primary Examiner*—Thomas J. Herbert, Jr.
*Attorney, Agent, or Firm*—Norman N. Spain

[57] ABSTRACT

An optically readable information disc having a carrier body of polycarbonate which on one side has an optically readable information track which is provided in the surface of the carrier body and which is covered with a reflection layer, the disc comprising an envelope of a cross-linked transparent synthetic resin extending as a closed envelope over the information track with reflection layer present on the upper side of the disc, over the edge of the disc and over the lower side of the disc.

2 Claims, 1 Drawing Figure

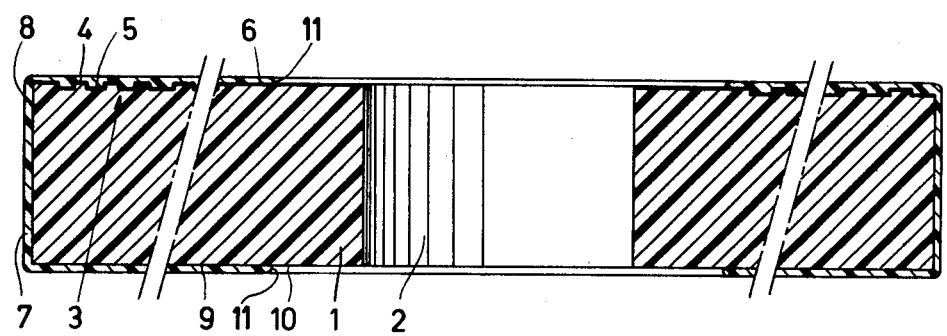

OPTICALLY READABLE INFORMATION DISC COMPRISING AN ENVELOPE OF CROSS-LINKED SYNTHETIC RESIN

The invention relates to an optically readable information disc comprising a carrier body of polycarbonate which on one side has an optically readable information track provided in the surface of the carrier body a reflection layer overlying the track, whereby the disc at playback is read by means of laser light which is focused on the track via the carrier body of polycarbonate.

The information track has a finely detailed structure of information areas situated alternately at a higher level and at a lower level. The difference in height between the areas is 0.1–0.2 $\mu$m. The longitudinal dimensions vary in accordance with the stored information and are approximately 0.3–3 $\mu$m. The stored information may be either audio information or video information.

A commercially available information disc of the above-mentioned type comprises audio (sound) information and is known in particular as an audio disc or compact disc. The disc has a diameter of 12 cm.

The synthetic resin polycarbonate, as compared with other transparent synthetic resins, has a low moisture sensitivity and therefore a good resistance to deformation. The glass transition temperature is comparatively high, which is favourable for the resistance to deformation at higher temperatures. The carrier body comprising the information track is manufactured by means of an injection moulding process or a compression moulding process, in which the polycarbonate synthetic resin is forced into a mould at elevated temperature and pressure, the mould having a die the surface of which carries a track which is the negative of the information track to be provided in the carrier body of polycarbonate. After cooling and reducing the pressure the resulting carrier body is coated on the side of the information track with a reflection layer of, for example, a metal such as a vapour-deposited or sputtered layer of Ag or Al. The metal mirror can be protected by means of a lacquer, for example a cellulose lacquer.

The quality of the sound produced by the disc very high.

It has been found, however, that in practical use the disc occasionally shows disturbances in the form of an audible tick. The cause hereof is not quite clear. The disturbance may be the result of various factors or combinations of factors. Examples of possible causes are locally occurring optical disturbances, for example, light scattering as a result of which the reading no longer occurs correctly.

The above-mentioned disturbance can be prevented by means of the measure according to the invention.

The invention relates more in particular to an optically readable information disc of the type mentioned in the opening paragraph which is characterized in that the disc comprises a mantle of a cross-linked transparent synthetic resin which extends as a closed envelope over the information track with reflection layer present on the upper side of the disc, over the edge of the disc and over the lower side of the disc.

The envelope adheres to the surface on the upper side, the edge and the lower side of the disc. The envelope is provided by dipping the disc in a crosslinkable liquid (lacquer) and then curing the resulting layer, for example, by heat or under the influence of radiation.

According to a suitable method the disc is positioned in a vertical position in the cross-linkable liquid and is then rotated. If a central hole is present in the disc, the disc is partly dipped in the above-mentioned liquid down to a level at which the central hole remains amply free from the liquid. The disc is rotated in the liquid and then removed herefrom. The provided layer of liquid is equalized by centrifuged the disc, a desired layer thickness being obtained dependent on the speed of rotation and the viscosity of the liquid. A highly suitable layer thickness is 10–20 $\mu$m.

A suitable cross-linkable liquid is a lightcurable composition, such as U.V. light-curable composition which, for example, comprises a mixture of acrylates or of polyenethiol compounds and a photo-initiator. The layer is cured by exposing the disc on both sides and at the edge to ultraviolet light.

In a favourable embodiment of the information disc according to the invention the envelope is manufactured from a light-cured liquid composition which comprises a mixture of a polyester acrylate or epoxy acrylate, an urethane acrylate, a cross-linkable diluent and a photo-initiator.

In this preferred embodiment the envelope forms a hard, scratch and abrasion-resistant layer which is not brittle.

A suitable cross-linkable diluent is a low-molecular monomer compound, for example, mono-, di-, tri- or tetra-acrylates. Examples hereof are alkyl acrylates, for example ethylhexyl acrylate, alkanediol diacrylates, for example 1,6-hexanediol diacrylate, alkaneglycol diacrylates, for example tripropyleneglycol acrylate and triacrylates, for example trimethylolpropane triacrylate. Another well usable diluent is N-vinylpyrrolidone. The maximum molecular weight of the diluent is approximately 400. The viscosity of the diluent is low and is, for example, $1 \times 10^{-3}$ to $25 \times 10^{-3}$ Pa.s. An example of a suitable photo-initiator is 1,1 dimethoxy-1-phenylacetophenone which is commercially available by the tradename of Irgacure.

It is to be noted that an optical information disc is disclosed in the published Netherlands patent application No. 7703911 which, in contrast with the information disc according to the invention, comprises a non-transparent carrier body which on both sides has a reflecting optical structure which is coated by means of a layer of a light-pervious material.

Upon reading information in this published patent application, the reading laser light passes only through the transparent coating layer and not through the carrier body which has intentionally been chosen to be opaque to the reading laser light. The coating layers protect the reflecting optical structure and are mainly meant to function as optical spacing layers. By using the coating layers the dust particles present on the surface of the disc are kept beyond the depth of focus of the objective which focuses the laser light on the reflecting optical structures present below the coating layer.

The information disc according to the invention, however comprises a carrier body which on one side has a reflecting optical structure, the laser light used for reading passing through the carrier body. The carrier body in the information disc according to the invention has the function both of supporting member and of spacing layer. The optical characteristic of the carrier body of poly-carbonate is of essential importance. The invention relates to problems in connection with the properties, in particular the optical properties, of the carrier body. The problems underlying the invention as well as the solution found, therefore differ essentially from those of the above-mentioned Netherlands patent application No. 7703911.

In published European patent application No. 0037607 in the name of Applicants an optically readable information disc is described which comprises a carrier body of polyvinylchloride which on one side has a separate layer of synthetic resin in which a reflecting optical structure is provided. The carrier of polyvinylchloride is constructed from a number of stacked and mutually bonded foils of polyvinylchloride. The surface of the foil of polyvinylchloride and hence the surface of the carrier body has a pattern of fine scratches which are the result of the manufacturing method of the foil. As a result of this the servo signal which is necessary to keep the laser light beam on the information track is disturbed so that upon reading the laser light beam might stick, for example, to one track. In order to solve this the carrier body comprises on the reading side a transparent layer of, for example, a light-cured synthetic resin. The information disc according to the present invention does not comprise a carrier body of polyvinylchloride nor a separate layer of synthetic resin for the information track. In this case also it holds that the problems underlying the invention and the solution found are essentially different from those of the above-mentioned European patent application No. 0 037 607. An envelope according to the invention which covers the reflecting optical structure, the edge of the disc and the reading side of the disc is not known from the European patent application.

The invention will be described in greater detail with reference to the drawing of the sole FIGURE of which a cross-sectional view of an information disc according to the invention.

Reference numeral 1 in the FIGURE denotes a disc-like carrier body of polycarbonate having a thickness of 1.2 mm and a diameter of 12 cm. The carrier body has a central hole 2. On one side the carrier body comprises an optically readable information track 3 which comprises information areas 4 situated at a higher level and information areas 5 situated at a lower level. The track is covered with a reflection layer 6. Information track 3 is read by means of laser light which is focused on track 3 by means of an objective not shown. The laser light passes through the carrier body 1 of polycarbonate, is reflected against the optical structure and then again passes through the carrier 1 of polycarbonate. Reading occurs on the basis of phase differences between the forward beam and the reflected beam. An envelope 7 which provided as a closed envelope over the reflecting optical structure (3-6), the edge portion 8 and the reading side 9 of the disc. Part 10 of the disc situated around the central hole 2, falls beyond the optical structure and is not exposed to laser light during playback and, as is shown in the FIGURE, need not be provided with envelope 7.

The envelope is provided by rotating the disc in a vertical position in a cross-linkable liquid composition which has the following ingredients:

24% by weight of urethane acrylate
16% by weight of epoxy acrylate
54% by weight of tripopyleneglycol diacrylate
4% by weight of benzoin-isobutylether
2% by weight of silicone resin (65% solution in xylene).

For this purpose the disc is placed in the liquid composition down to the level indicated by 11. After at least one complete rotation the disc is removed from the liquid and centrifuged with a speed of rotation which reaches 1500 r.p.m., the excessive liquid being flung away. The disc is exposed to ultraviolet light on both sides and at the edge so that the layer of liquid is cured and an envelope 7 of cross-linked synthetic resin is formed.

What is claimed is:

1. An optically readable information disc comprising a carrier body of polycarbonate which on one side has an optically readable information track which is provided in the surface of the carrier body and a reflection layer overlying the track, whereby the disc at playback is read by means of laser light which is focused on the information track via the carrier body of polycarbonate, characterized in that the disc comprises a mantle of a cross-linked transparent synthetic resin which extends as a closed envelope over the information track with the reflection layer present on the upper side of the disc, over the edge and over the lower side of the disc.

2. An optically readable information disc as claimed in claim 1, characterized in that the envelope is manufactured from a light-cured liquid composition which comprises a mixture of a polyester acrylate or an epoxy acrylate, an urethane acrylate, a cross-linkable diluent and a photo-initiator.

* * * * *

UNITED STATES PATENT AND TRADEMARK OFFICE
CERTIFICATE OF CORRECTION

PATENT NO. : 4,448,827
DATED : May 15, 1984
INVENTOR(S) : HENRICUS G.J.A.M. LUIJBEN ET AL

It is certified that error appears in the above-identified patent and that said Letters Patent is hereby corrected as shown below:

Column 1, line 44, After "disc" insert --is--

Column 4, lines 3 and 4, Delete "An envelope 7 which provided as" and insert --Envelope 7 provides--

Signed and Sealed this

Eighteenth Day of September 1984

[SEAL]

Attest:

GERALD J. MOSSINGHOFF

Attesting Officer    Commissioner of Patents and Trademarks